United States Patent [19]

Livermore et al.

[11] 4,318,158

[45] Mar. 2, 1982

[54] BULBHOLDER AND FILTER ASSEMBLY

[75] Inventors: Malcolm J. Livermore, Boreham; John C. Hobbs, Loughton, both of England

[73] Assignee: Ford Motor Company, Dearborn, Mich.

[21] Appl. No.: 28,133

[22] Filed: Apr. 9, 1979

[30] Foreign Application Priority Data

May 30, 1978 [GB] United Kingdom ............... 24519/78

[51] Int. Cl.³ ............................................ G01D 11/28
[52] U.S. Cl. ..................................... 362/29; 362/226; 362/293; 362/368; 362/363
[58] Field of Search ................ 362/29, 226, 293, 368, 362/363

[56] References Cited

U.S. PATENT DOCUMENTS 4,177,497 12/1979 McCook et al. ................ 362/29 X

*Primary Examiner*—Stephen J. Lechert, Jr.
*Attorney, Agent, or Firm*—Peter Abolins; Clifford L. Sadler

[57] ABSTRACT

This specification discloses a bulbholder assembly incuding a mounting carrying a coupling toward one end whereby the one end can be inserted into an aperture in a supporting wall and secured therein. The bulbholder assembly includes a bulbholder removably mounted in the end of the mounting with the coupling. The bulbholder is capable of being inserted into the aperture with the mounting as a unit from one side of the supporting wall to project through the aperture for removal from the mounting from the other side of the supporting wall. As a result, in order to change a faulty or used bulb, the holder can be removed from the rear of the supporting wall by withdrawing the holder from the mounting or, alternatively, the mounting can be disconnected from the front of the aperture and the holder detached from the mounting. Thus, a bulb can be changed from the front or the rear.

6 Claims, 6 Drawing Figures

BULBHOLDER AND FILTER ASSEMBLY

BACKGROUND OF THE INVENTION (1) Field of the Invention

This invention relates to bulbholder assemblies.

(2) Prior Art

Conventional bulbholders, such as those used to illuminate instrument clusters or other installations comprise a bulbholder which is adapted to be mounted in a hole in a rear wall of the instrument cluster, usually by one or more pairs of mounting lugs which project radially outwardly from the holder. The bulbholder is inserted into the hole from the rear of the instrument cluster so that the bulb will illuminate the front surface of the wall, and is secured in position by rotating the bulbholder to bring the mounting lugs into engagement with the wall. A light transmitting filter of suitable color is mounted on the front surface of the rear wall of the cluster over the bulb to provide illumination of a required color.

In order to change a faulty or used bulb in such installations, it is always necessary to gain access to the rear of the wall in which the bulbholder is mounted and to remove the complete assembly from the wall. In many installations, it is desirable that the bulb be capable of being replaced both from the front and rear of the installations. Thus, in motor vehicle instrument clusters it is desirable that the bulbholder should be removable from the front of the cluster, so that after installation in the vehicle, used bulbs can be replaced during routine maintenance of the vehicle. However, it is also desirable that the bulb should be accessible from the rear of the cluster, so that faulty bulbs can be replaced during testing of the instrument cluster prior to the installation in the motor vehicle.

SUMMARY OF THE INVENTION

According to the present invention there is provided a bulbholder assembly comprising a mounting carrying a coupling towards one end, whereby the said end may be inserted into an aperture in a supporting wall and secured therein, and a bulbholder removably mounted in the said one end of the mounting and capable of being inserted into the aperture with the mounting as a unit from one side of the supporting wall to project through the aperture for removal from the mounting from the other side of the supporting wall.

In order to change a faulty or used bulb, the holder can be removed from the rear of the supporting wall by withdrawing the holder from the mounting or, alternatively, the mounting can be disconnected from the front of the aperture and the holder detached from the mounting.

Preferably, the mounting carries a light transmitting tics material. Such mountings can advantageously be formed with an integral finger grip, for example in the form of a tab projecting from the filter.

The connection between the holder and mounting can be of any suitable construction. Desirably, in order to minimize the number of component parts of the assembly, the mounting carries an electrical contact on its internal surface, the holder carries an electrical contact on its external surface, and the holder is retained in the mounting by engagement of the two contacts. At least one of the contacts is resiliently deformable to allow the holder to be withdrawn from the mounting.

In order to facilitate the positioning of the holder within the mounting in the required orientation, the internal surface of the mounting and the external surface of the holder are provided with complementary guides and followers.

The coupling means preferably comprises at least one pair of lugs projecting radially outwardly from the mounting, the lugs of the pair being arranged to lie adjacent front and rear surfaces of a supporting wall, whereby the said one end of the mounting may be inserted into the aperture and rotated to position the lugs on opposite sides of the wall.

In the preferred embodiment of the invention, one lug or each pair of lugs defines a cam surface which is arranged to engage an edge of one surface of the supporting wall when the mounting is rotated in the aperture, thereby locking the mounting in the aperture.

Conveniently, one of the lugs of a pair of lugs, preferably the lug nearer the end of the mounting opposite the end in which the holder is mounted, carries an electrical contact for engagement with a printed circuit on one surface of the supporting wall. This lug is preferably circumferentially off set from the other lug of the pair so that the lug carrying the contact is always in contact with the printed circuit whilst the mounting is rotated in the aperture.

Advantageously, the invention can specifically include an instrument cluster comprising a housing in which one or more instruments are mounted for viewing from a front surface thereof, a supporting wall through which electrical and mechanical connections pass to the instruments, and a bulbholder assembly according to the invention mounted in an aperture in the supporting wall with the holder projecting from the rear surface thereof.

DETAILED DESCRIPTION OF THE INVENTION

Figure 1:
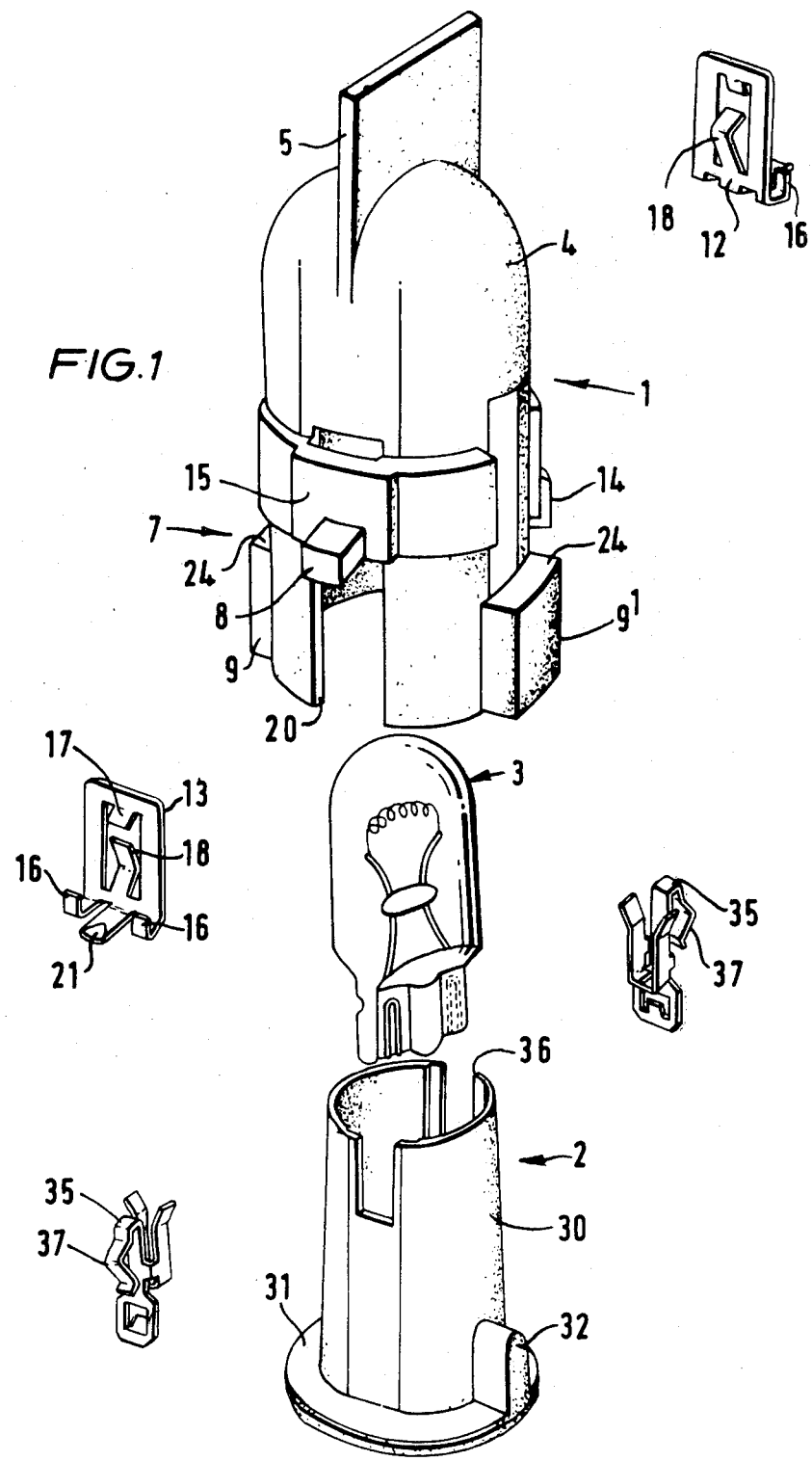
FIG. 1 is an "exploded" perspective view of a first embodiment of a bulbholder assembly.

Two embodiments of the invention will now be described by way of example only. Referring to the drawings, the assembly comprises a mounting 1, a bulbholder 2 and a bulb 3. The mounting 1 is an integral moulding of light transmitting plastics material, e.g., polypropylene, which includes a domed filter 4, a finger grip in the form of an outwardly projecting tab 5 at one end and a coupling indicated generally at 7 towards the other end of the mounting, which end is open to receive the bulb 3 and bulbholder 2.

Figure 2:
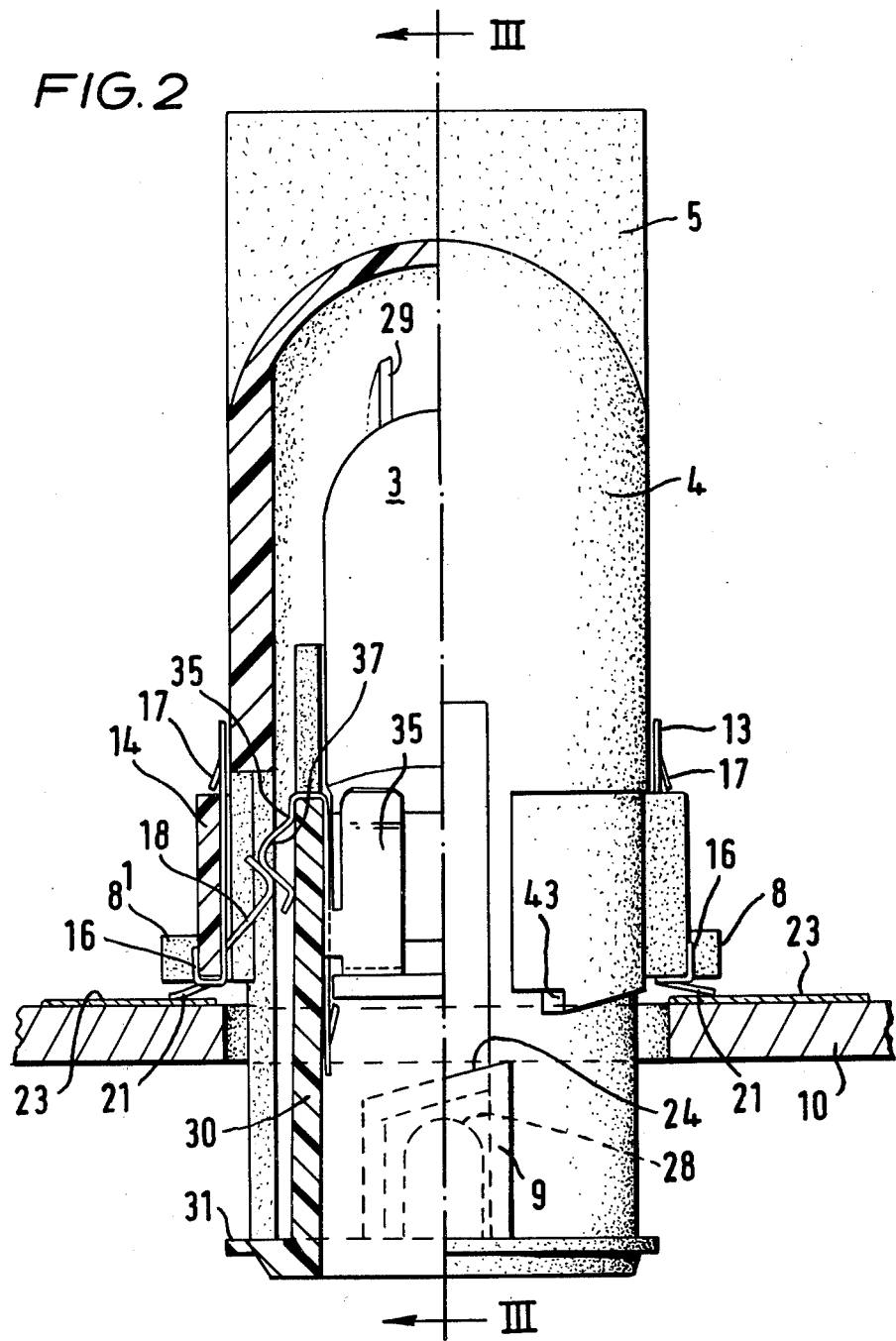
FIG. 2 is a side view of the assembly of FIG. 1, partially in cross section, installed in a supporting wall.
Figure 3:
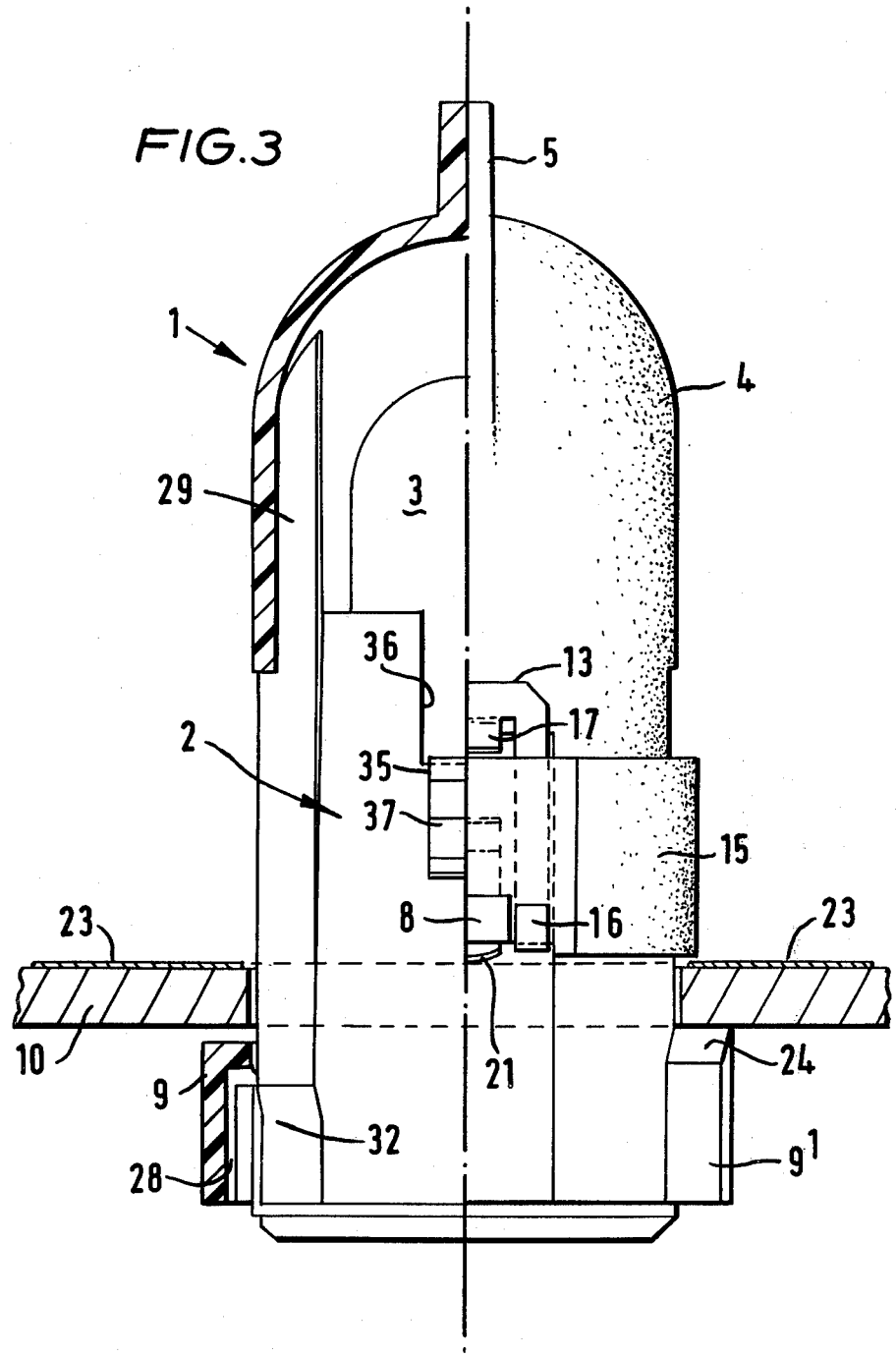
FIG. 3 is a similar view to FIG. 2 taken along line III—III.
Figure 4:
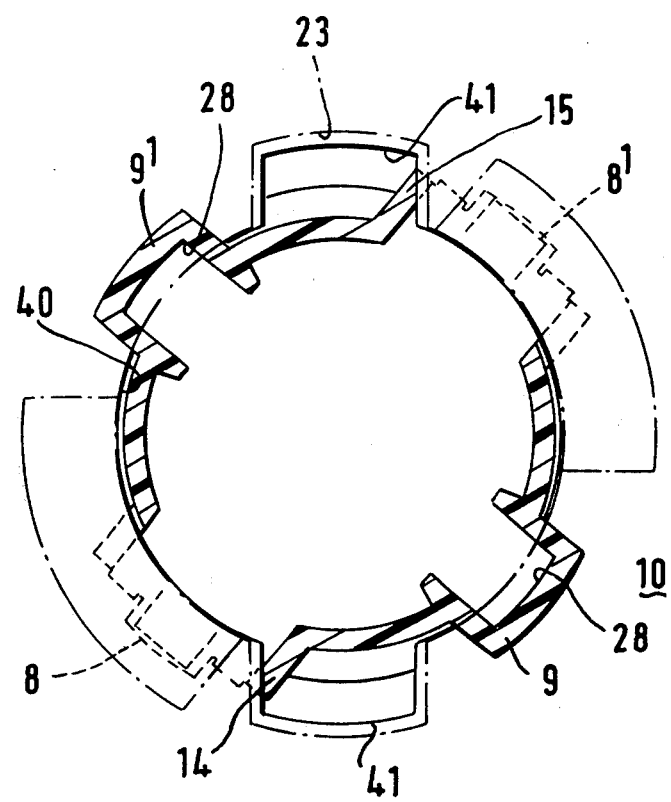
FIG. 4 is a bottom view of the assembly as shown in FIGS. 2 and 3 with its bulbholder removed.

The coupling 7 comprises two parts of lugs 8, 8', 9, 9' which project radially outwardly from the external surface of the mounting (FIG. 4). The lugs of each pair are circumferentially off set from each other by 90°, and are spaced axially from each other to receive between themselves a supporting wall 10 (FIG. 2) in which the assembly is to be mounted. Two metal spring contacts 12, 13 are each carried by a respective band 14, 15 moulded integrally with the mounting, as best illustrated in FIG. 2. The contacts 12, 13 are held on the bands 14, 15 by two hooks 16 and a spring tang 17. A contact arm 18 extends from each spring contact 12, 13 radially into the mounting 1 through a respective slot 20 in the housing, and a wiper blade 21 on each spring contact extends radially outwardly therefrom and lies beneath the lugs 8, 8' for engagement with a printed circuit 23 on the front side of the supporting wall 10 to the wall adjacent the filter 4.

The lugs 9, 9' nearer the open end of the mounting 1 define cam surfaces 24 which extend helically around the exterior surface of the mounting 1. The internal surfaces of the lugs 9, 9' define slots 28 which act as guides for the bulbholder 2. Additional guidance is provided by internal ribs 29 on the mounting 1.

The bulbholder 2 comprises a frusto-conical tube 30 carrying a flange 31, which acts as a finger grip. Two radial projections 32 extend outwardly from the wall of the tube 30 up to the edge of the flange 31. These projections are received in the slots 28 and act as followers during insertion of the holder into the mounting 1. The bulb 3 is held in the holder 2 by means of spring clips 35 which are engaged around the edge of the tube 30 in two slots 36, 36. Each spring clip carries a contact arm 37 which extends radially outwardly from the holder in registry with the contact arms 18 on the mounting 1.

As best seen in FIG. 4, the assembly is mounted in a generally circular aperture 40 in the wall 10, the aperture having two diametrically opposed radial recesses 41 corresponding in shape to the lugs 9, 9'. In order to mount the assembly in the supporting wall 10, the bulb 3 is inserted into the spring clips 35 in the holder 2 and the holder 2 is inserted into the open end of the mounting 1 so that the projections 32 on the holder engage in the slots 36, 36 in the mounting 1. The entry of the bulb and bulbholder into the mounting 1 is guided by the ribs 29 which engage the bulb 3, and the slots 36, 36 so that the two sets of contact arms 18 and 37 are brought into abutment. All four arms are radially movable and have cam surfaces which bias the holder positively into an engaged position as shown in FIG. 2.

Using the tag 5, the assembly can then be inserted as a unit into the aperture 40, the edge of the flange 31 being chamfered to facilitate this insertion.

The lower lugs 8, 9' pass through the radial recesses 41 and the wiper blades 21 adjacent the upper lugs 8, 8' engage with the front surface of the supporting wall 10, which carries the printed circuit 23. The assembly is then rotated in the direction indicated by the arrow A in FIG. 4 thus bringing the helical cam surfaces 24 into contact with the rear edges 42 of the recesses 41 and thereby ensuring that the printed circuit 23 and the supporting wall 10 are gripped firmly between the two pairs of lugs 8, 9. Stop surfaces 43 on the under side of the bands 14, 15 engage with the sides of the recesses 41 to limit the rotation of the assembly in the aperture 40. Since the lugs 8, 8' are offset from the lugs 9, 9' the upper blades 21 are constantly in contact with the printed circuit 23 during the rotation of assembly in the aperture, thus minimizing the risk of damage to the printed circuit 23.

Faulty or used bulbs can be replaced either from the front of the assembly, by reversing the procedure described above, or from the rear of the assembly by withdrawing the holder 2 from the assembly and leaving the mounting 1 secured in the aperture 40.

Figure 5:
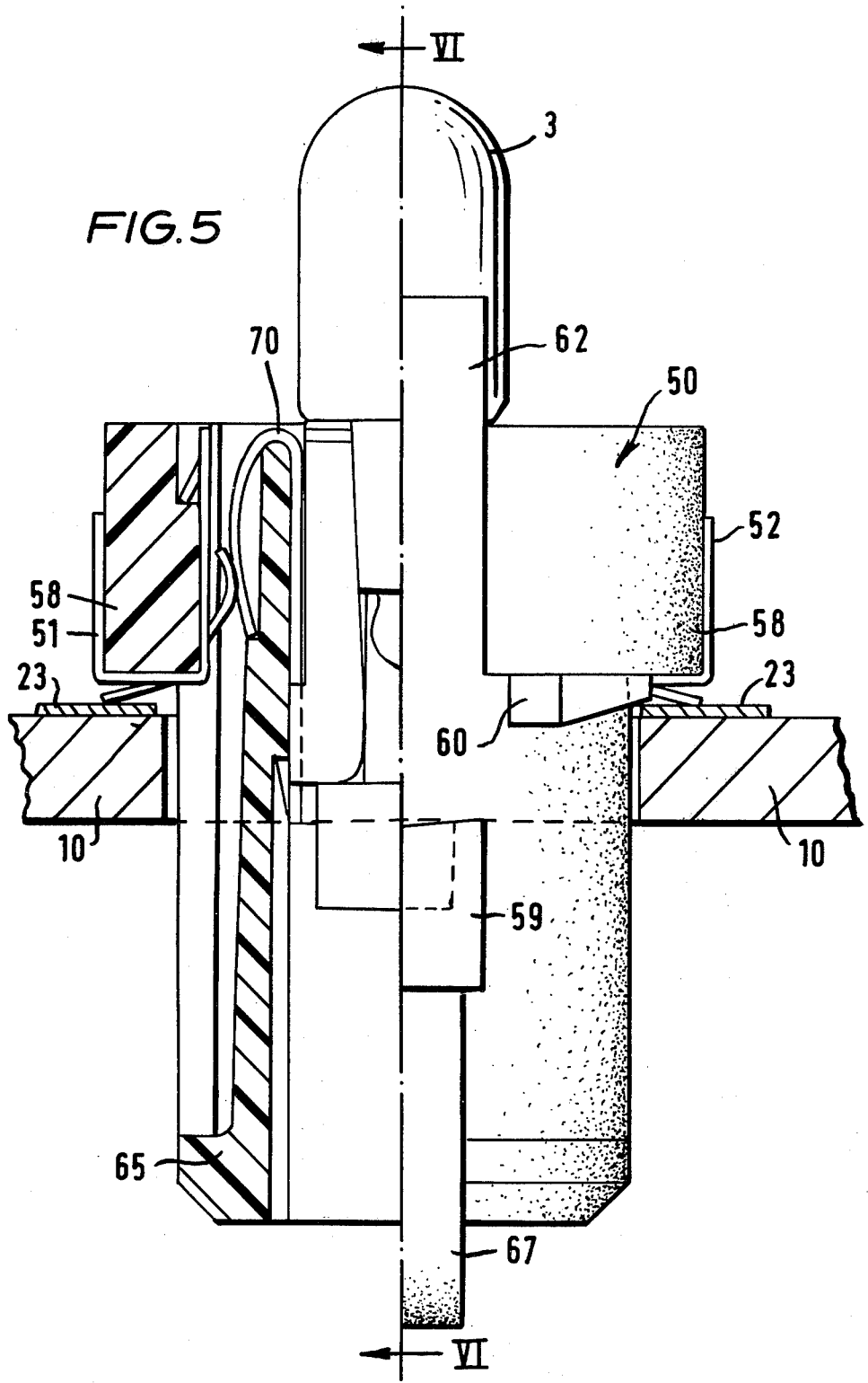
FIG. 5 is a partly sectional side view of a second embodiment of a bulbholder assembly.
Figure 6:
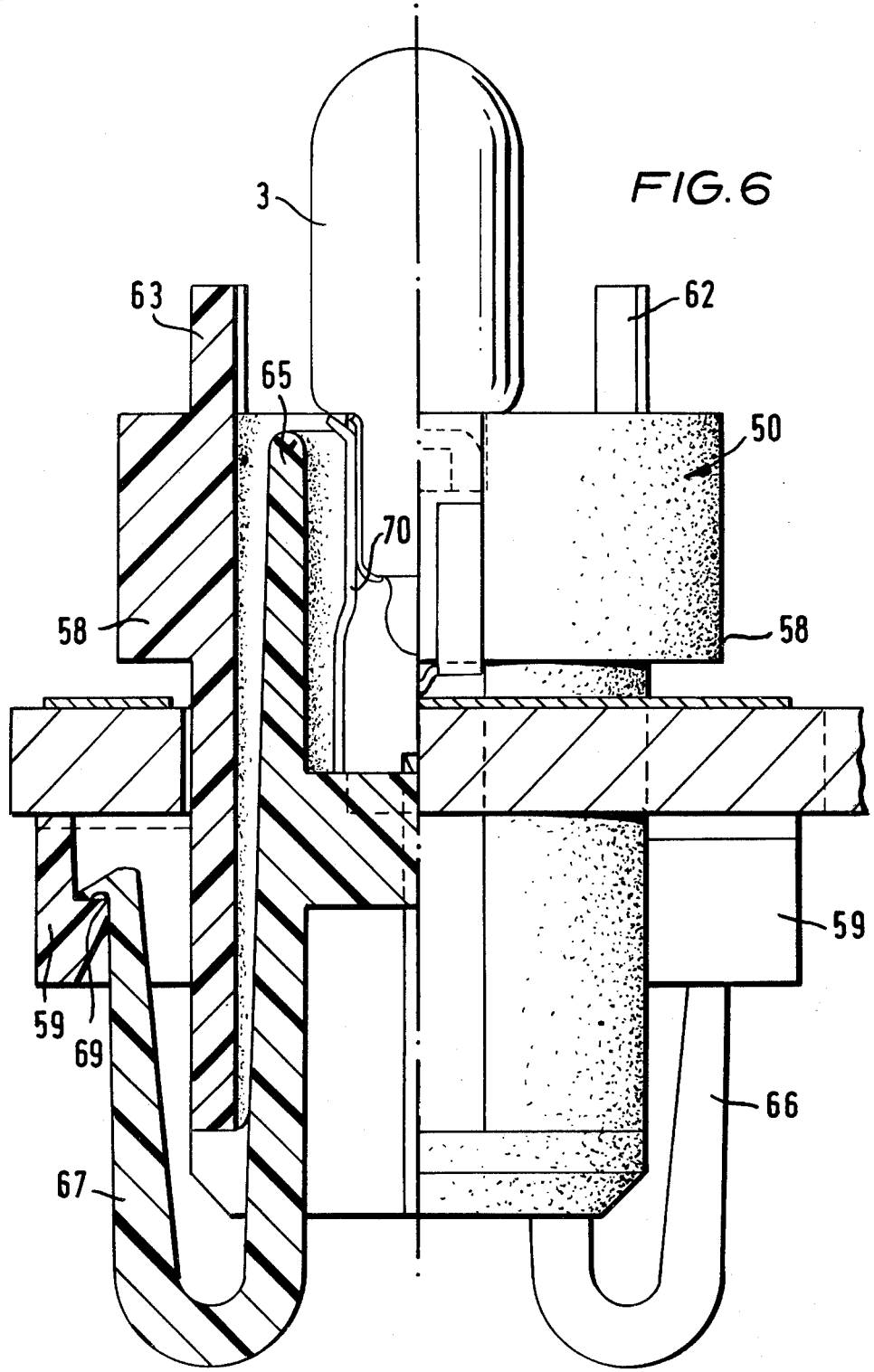
FIG. 6 is another partly sectional side view of the assembly of FIG. 5 taken along line VI—VI.

FIGS. 5 or 6 illustrate an alternative embodiment of the invention which does not incorporate a light filter. The assembly comprises a mounting 50 carrying two metal spring contacts 51, 52 similar to the contacts 12, 13 of the first embodiment which engage with the printed circuit 23 on the front surface of the supporting wall 10. The mounting 50 carries a coupling comprising two arcuate upper lugs, 58, 58 and two lower lugs 59, 59 circumferentially off set from the upper lugs 58. The two pairs of lugs 58, 59, 58, 59 act in the same manner on the lugs 8, 8', 9, 9' of the first embodiment. The mounting also carries a stop surface 60, which acts similarly to the stop surface 43 of the first embodiment. Two upstanding tabs 62, 63 on the mounting 50 facilitate manipulation of the assembly.

A bulb holder 62 is removably mounted in one end of the mounting 50. The holder 65 includes two resilient catches 66, 67 which engage with radially extending ledges 69 formed on the internal surfaces of the lower lugs 59 to retain the holder in the mounting. Electrical contacts 70 similar to those of the first embodiment are mounted in the upper end of the holder. These contacts retaining are electrical bulb 3 within the holder and engage the spring contacts 51, 52 of the mounting when the holder is positioned in the mounting.

The assembly is installed in an aperture in the supporting wall 10 of similar shape to that of the first embodiment. The installation of the assembly from the front surface of the supporting wall is effected by a similar procedure to that used with the first embodiment of the invention. In order to remove the holder from the mounting from the rear of the wall 10, the two catches are moved radially inwardly to disengage them from the ledges 68, 69 and the holder is withdrawn axially.

The embodiments of the invention described above therefore provide an assembly which can be serviced from both sides of the installation in which it is mounted, and which is of cheap construction. Moreover, the assembly can be easily manipulated with a minimum risk of damage to surrounding components and printed circuit.

Various modifications and variations will no doubt occur to those skilled in the various arts to which this invention pertains. For example, the particular configuration of the light transmitting filter may be varied from that disclosed herein. Also, some of the relative sizes of the various components may be varied from that disclosed herein. These and all other variations which basically rely on the teachings through which this disclosure has advanced the art are properly considered within the scope of this invention.

We claim:

1. A bulbholder assembly comprising a mounting carrying a coupling towards one end, whereby said one end may be inserted into an aperture in a supporting wall and secured therein, and a bulbholder removably mounted in said one end of said mounting and capable of being inserted into the aperture with said mounting as a unit from one side of the supporting wall to project through the aperture for removal from said mounting from the other side of the supporting wall;

a light transmitting filter being carried on the one end of said mounting opposite said coupling, said filter being formed integrally with said mounting, and including an integral finger grip comprising a tab projecting from said filter;

said mounting having an internal surface and carrying an electrical contact on said internal surface, said bulb holder having an external surface and carrying an electrical contact on said external surface, and said bulbholder being retained in said mounting by engagement of the two contacts, at least one of the contacts being resiliently movable to allow said holder to be withdrawn from said mounting;

said internal surface of said mounting and said external surface of said bulbholder being provided with complementary guides and followers which position said bulbholder relative to said mounting when said holder is inserted into said mounting;

said coupling comprising at least one pair of lugs projecting radially outwardly from the mounting, said at least one pair of lugs being arranged to lie adjacent front and rear surfaces of a supporting wall, whereby the said one end of said mounting may be inserted into the aperture and rotated to position the lugs on opposite sides of the wall; and one lug of said at least one pair of lugs carrying an electrical contact for engagement with a printed circuit on one surace of the supporting wall.

2. An assembly according to claim 1 wherein the lug nearer the said one end of the mounting carries the electrical contact.

3. An assembly according to claim 1 wherein one lug of said at least one pair of lugs defines a cam surface which is arranged to engage an edge of one surface of the supporting wall when said mounting is rotated in the aperture, thereby locking said mounting in the aperture.

4. An assembly according to claim 3 wherein said mounting carries a stop for engaging an edge on one surface of the supporting wall to limit the rotation of said mounting in the aperture.

5. An assembly according to claim 3 wherein the lugs in said at least one pair of lugs are circumferentially offset from each other.

6. An instrument cluster comprising a housing in which one or more instruments are mounted for viewing from a front surface of the housing, a supporting wall through which electrical and mechanical connections pass to the instruments and a bulbholder assembly mounted in an aperture in said supporting wall with a bulbholder projecting from the rear surface thereof;

said bulbholder assembly comprising a mounting carrying a coupling toward one end, whereby said one end may be inserted into said aperture in said supporting wall and secured therein, and said bulbholder being removably mounted in said one end of said mounting and capable of being inserted into said aperture with said mounting as a unit inserted into said aperture with said mounting as a unit from one side of said supporting wall to project through said aperture for removal from said mounting from the other side of said supporting wall, a light transmitting filter being carried on the end of said mounting opposite said coupling, said filter being formed integrally with said mounting and including an integral tab finger grip;

said mounting having an internal surface and carrying a first electrical contact on said internal surface;

said bulbholder having an external surface and carrying a second electrical contact on said external surface;

said bulbholder being retained in said mounting by engagement of said first and second electrical contacts, at least one of said first and second electrical contacts being resiliently movable to allow said holder to be withdrawn from said mounting;

said mounting being made of a light transmitting plastic material and including an integral finger grip, said finger grip being in the form of an outwardly projecting tab;

said coupling comprising a first and a second pair of lugs which project radially outward away from said mounting, said lugs of each pair being circumferentially offset from each other by about 90° and spaced axially from each other to receive between themselves said supporting wall;

said bulbholder comprising a frusto conical tube carrying a flange means for acting as a finger grip and two radial projections extending outwardly from said tube adjacent the edge of said flange; and said coupling including a slot for receiving said radial projections and acting as followers during insertion of said bulbholder into said mountin

* * * * *